United States Patent
Koh et al.

(10) Patent No.: US 9,482,953 B2
(45) Date of Patent: Nov. 1, 2016

(54) LITHOGRAPHY APPARATUS HAVING EFFECTIVE THERMAL ELECTRON ENHANCEMENT UNIT AND METHOD OF FORMING PATTERN USING THE SAME

(71) Applicant: Samsung Electronics Co., Ltd., Suwon-si, Gyeonggi-do (KR)

(72) Inventors: Cha-Won Koh, Yongin-si (KR); Jeon-Il Lee, Suwon-si (KR); Su-Min Kim, Suwon-si (KR); Hyun-Woo Kim, Seongnam-si (KR); Jin Park, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 116 days.

(21) Appl. No.: 14/177,278

(22) Filed: Feb. 11, 2014

(65) Prior Publication Data
US 2014/0327894 A1 Nov. 6, 2014

(30) Foreign Application Priority Data
May 6, 2013 (KR) .................. 10-2013-0050906

(51) Int. Cl.
G03B 27/68 (2006.01)
G03F 7/20 (2006.01)
G03F 7/00 (2006.01)

(52) U.S. Cl.
CPC ........... *G03F 7/2022* (2013.01); *G03F 7/0002* (2013.01)

(58) Field of Classification Search
CPC ....................... G03F 7/2022; G03F 7/0002
See application file for complete search history.

(56) References Cited

U.S. PATENT DOCUMENTS

| 5,258,266 A * | 11/1993 | Tokui | G03F 7/38 430/270.1 |
| 6,646,274 B1 * | 11/2003 | Bleeker | B82Y 10/00 250/491.1 |
| 6,841,342 B2 * | 1/2005 | Nishi | G03F 7/38 118/302 |
| 6,908,861 B2 | 6/2005 | Sreenivasan et al. | |
| 6,924,492 B2 * | 8/2005 | Van Schaik | G03F 7/70925 250/492.1 |
| 7,248,332 B2 | 7/2007 | Owen | |
| 7,318,997 B2 | 1/2008 | Kim et al. | |
| 8,115,901 B2 | 2/2012 | Hayashi | |

(Continued)

FOREIGN PATENT DOCUMENTS

| JP | 2005-332923 A | 12/2005 |
| JP | 2006-032957 A | 2/2006 |

(Continued)

OTHER PUBLICATIONS

Machine translation of JP 2008-172086.*

(Continued)

*Primary Examiner* — Deoram Persaud
(74) *Attorney, Agent, or Firm* — Lee & Morse, P.C.

(57) ABSTRACT

A lithography apparatus and a method of using the same, the apparatus including a stage for accommodating a substrate that has a photoresist film thereon; a main unit on the stage, the main unit being configured to irradiate a projection beam to the photoresist film; and an electric field unit adjacent to the stage, the electric field unit being configured to apply an electric field to the photoresist film, wherein the electric field unit is configured to be turned on at a same time as or before irradiation of the projection beam, and is configured to be turned off at a same time as or after termination of the projection beam.

18 Claims, 11 Drawing Sheets

(56) References Cited

U.S. PATENT DOCUMENTS

| | | | | |
|---|---|---|---|---|
| 2005/0275821 | A1* | 12/2005 | Miyajima | G03F 7/70916 355/69 |
| 2006/0147841 | A1* | 7/2006 | Ohmi | G03F 7/70291 430/311 |
| 2007/0273858 | A1* | 11/2007 | Nagasaka | G03F 7/70208 355/67 |
| 2008/0123086 | A1* | 5/2008 | Kudo | G03F 7/70591 356/124 |
| 2009/0135396 | A1* | 5/2009 | Mizuno | G03F 1/144 355/71 |
| 2009/0153819 | A1* | 6/2009 | Okita | G03F 7/70283 355/53 |
| 2010/0134774 | A1* | 6/2010 | Lee | G03F 7/70641 355/55 |
| 2010/0149503 | A1* | 6/2010 | Goehnermeier | G03F 1/14 355/55 |
| 2010/0253929 | A1* | 10/2010 | Stanton | G03B 27/72 355/71 |
| 2014/0193755 | A1* | 7/2014 | Wise | G03F 7/2004 430/319 |

FOREIGN PATENT DOCUMENTS

| | | | | |
|---|---|---|---|---|
| JP | 2008172086 A | * | 7/2008 | H01L 21/027 |
| KR | 10-2002-0055173 A | | 7/2002 | |
| KR | 10-0390825 B1 | | 6/2003 | |
| KR | 10 2005-0032869 A | | 4/2005 | |
| KR | 10-0515369 B1 | | 9/2005 | |
| KR | 10-2008-0067132 A | | 7/2008 | |
| KR | 10-2009-0052274 A | | 5/2009 | |

OTHER PUBLICATIONS

Lee, et al.; "Shot noise and process window study for printing small contact holes using EUV Lithography;" Emerging Lithographic Technologies VII; 2003; pp. 890-899; vol. 5037; Proceedings of SPIE.

Cameron, et al.; "Comparison of EUV and e-Beam Lithographic Technologies for Sub 22nm Node Patterning;" Extreme Ultraviolet (EUV) Lithography III, 2012; pp. 83222F 1-83222F 12; vol. 8322; Proceedings of SPIE.

Wallow, et al.; "EUV resist performance: current assessment for sub-22 nm half-pitch patterning on NXE:3300;" Extreme Ultraviolet (EUV) Lithography III; 2012; pp. 83221J 1-83221J 12; vol. 8322; Proceedings of SPIE.

Cho, et al.; "Key Parameters of EUV Resists for Contact Hole Applications;" Extreme Ultraviolet (EUV) Lithography III; 2012; pp. 83221B 1-83221B 9; vol. 8322; Proceedings of SPIE.

* cited by examiner

LITHOGRAPHY APPARATUS HAVING EFFECTIVE THERMAL ELECTRON ENHANCEMENT UNIT AND METHOD OF FORMING PATTERN USING THE SAME

CROSS-REFERENCE TO RELATED APPLICATION

Korean Patent Application No. 10-2013-0050906, filed on May 6, 2013, in the Korean Intellectual Property Office, and entitled: "Lithography Apparatus Having Effective Thermal Electron Enhancement Unit and Method Of Forming Pattern Using The Same," is incorporated by reference herein in its entirety.

BACKGROUND

Embodiments relate to a lithography apparatus having an effective thermal electron enhancement unit and a method of forming a pattern using the same.

SUMMARY

Embodiments are directed to a lithography apparatus having an effective thermal electron enhancement unit and a method of forming a pattern using the same The embodiments may be realized by providing a lithography apparatus including a stage for accommodating a substrate that has a photoresist film thereon; a main unit on the stage, the main unit being configured to irradiate a projection beam to the photoresist film; and an electric field unit adjacent to the stage, the electric field unit being configured to apply an electric field to the photoresist film, wherein the electric field unit is configured to be turned on at a same time as or before irradiation of the projection beam, and is configured to be turned off at a same time as or after termination of the projection beam.

The electric field may be perpendicular to a surface of the substrate.

The electric field unit may include a lower electrode under the stage; and a power supply system connected to the lower electrode.

The power supply system may supply a power having frequencies of about 1 Hz to about 300 MHz and peak-to-peak voltages of about 5 KV to about 50 KV.

The electric field unit may further include an upper electrode connected to the power supply system, the upper electrode being arranged between the substrate and the main unit.

The projection beam may include an extreme ultraviolet (EUV) or electron beam (E-beam).

The main unit may include an EUV generator and a reticle having a reflective mask pattern.

The lithography apparatus may further include an auxiliary unit adjacent to the main unit, the auxiliary unit being configured to irradiate a microwave, or a light having a longer wavelength than the projection beam.

The auxiliary unit may be configured to be turned on at the same time as or before irradiation of the projection beam, and may be configured to be turned off at the same time as or after termination of the projection beam.

The auxiliary unit may be configured to irradiate the light having a longer wavelength than the projection beam, the light having a longer wavelength than the projection beam having a wavelength of about 350 nm or higher.

The auxiliary unit may be configured to irradiate the light having a longer wavelength than the projection beam, the light having a longer wavelength than the projection beam having a wavelength of 365 nm, 435 nm, 633 nm, or 808 nm.

The auxiliary unit may be configured to irradiate the microwave, the microwave being in a range of about 300 MHz to about 30 GHz.

The embodiments may also be realized by providing a method of forming a pattern, the method including installing the substrate on which the photoresist film is formed, on the stage of the lithography apparatus according to an embodiment; applying the electric filed to the photoresist film; irradiating the projection beam to the photoresist film; and developing the photoresist film.

The electric field may be applied at a same time as or before irradiation of the projection beam, and may be turned off at a same time as or after termination of the projection beam.

The method may further include irradiating a microwave or a light having a longer wavelength than the projection beam, to the photoresist film, while irradiating the projection beam to the photoresist film.

The embodiments may also be realized by providing a lithography apparatus including a stage for accommodating a substrate having a photoresist film thereon; a main unit on the stage, the main unit being configured to irradiate a projection beam to the photoresist film; and an auxiliary unit adjacent to the stage, the auxiliary unit being configured to irradiate a microwave or a light having a longer wavelength than the projection beam, wherein the auxiliary unit is configured to be turned on at a same time as or before irradiation of the projection beam, and is configured to be turned off at the same time as or after termination of the projection beam.

The embodiments may also be realized by providing a lithography apparatus including a stage for accommodating a substrate having a photoresist film thereon; a main unit on the stage, the main unit being configured to irradiate a projection beam to the photoresist film; and at least one of an electric field unit adjacent to the stage, the electric field unit being configured to apply an electric field to the photoresist film, or an auxiliary unit adjacent to the stage, the auxiliary unit being configured to irradiate a microwave or a light having a longer wavelength than the projection beam, wherein the electric field unit is configured to be turned on at a same time as or before irradiation of the projection beam, and is configured to be turned off at a same time as or after termination of the projection beam, and the auxiliary unit is configured to be turned on at a same time as or before irradiation of the projection beam, and is configured to be turned off at the same time as or after termination of the projection beam:

The projection beam may include an extreme ultraviolet (EUV) or electron beam.

The main unit may include an EUV generator and a reticle having a reflective mask pattern.

The EUV generator may generate EUV having a wavelength of 13.5 nm and an energy of 92.5 eV.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
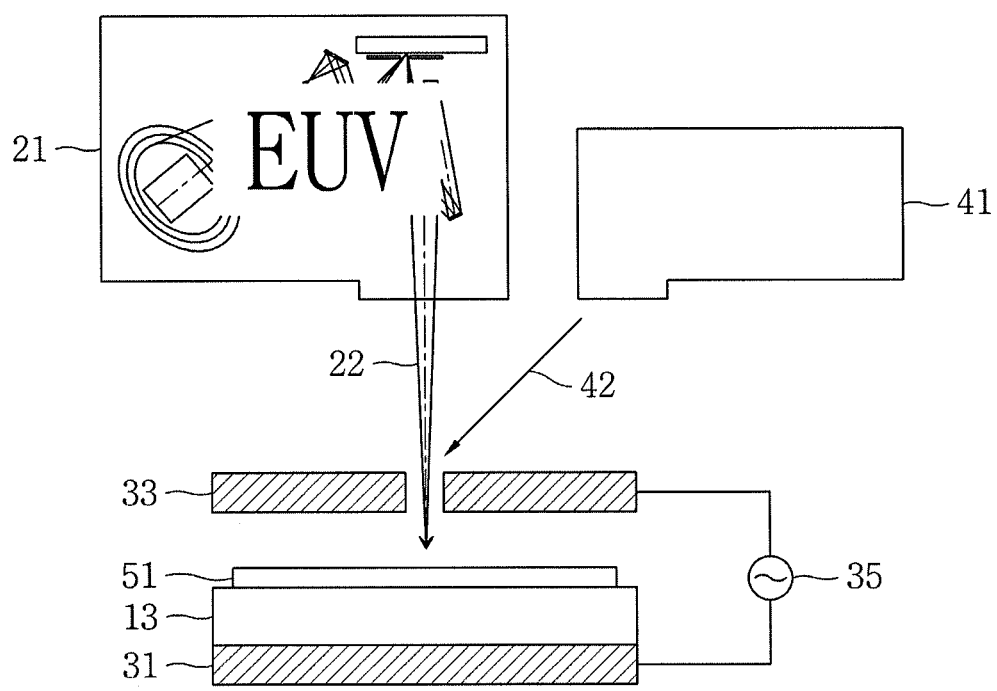
FIG. 1 illustrates a schematic diagram of a lithography apparatus in accordance with embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Figure 2:
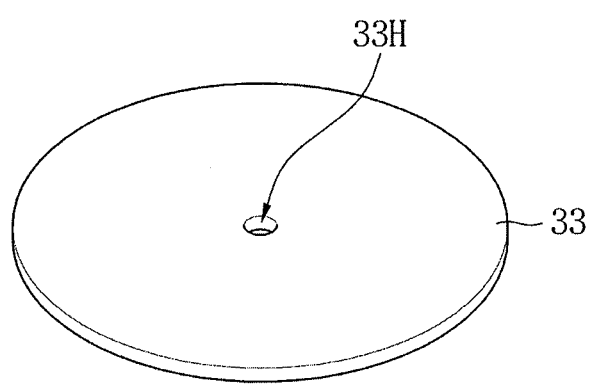
FIGS. 2 to 4 illustrate perspective views of electrodes of lithography apparatuses in accordance with embodiments.
Figure 3:
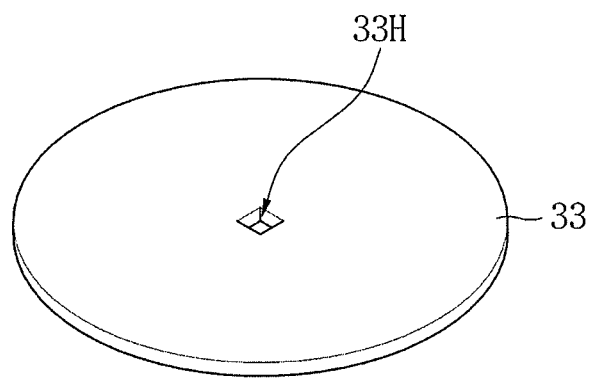
Figure 4:
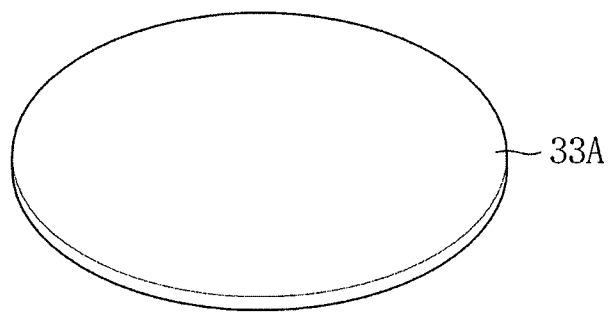
Figure 5:
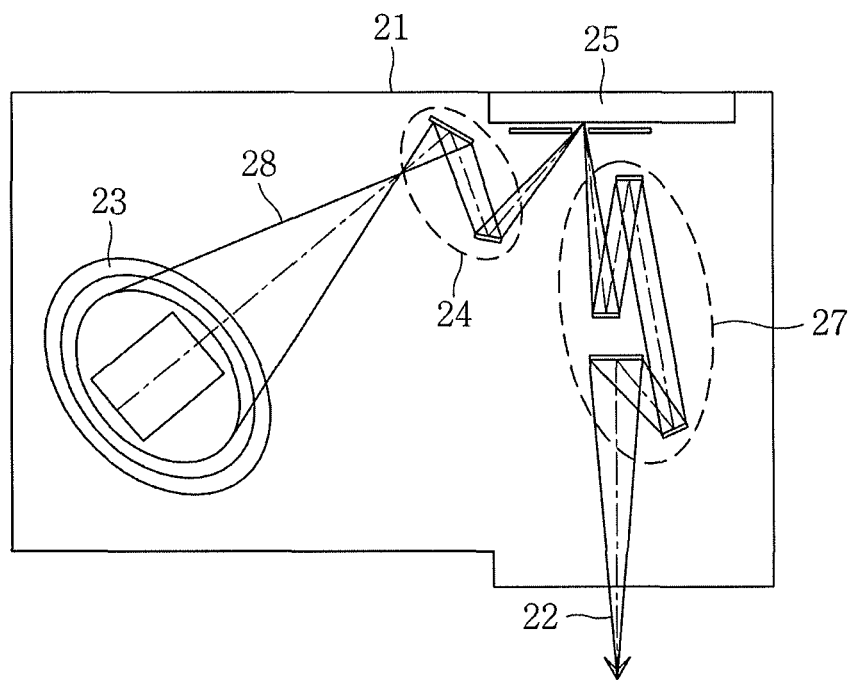
FIG. 5 illustrates an enlarged view of a portion of the lithography apparatus in accordance with embodiments, in detail.

FIG. 1 illustrates a schematic diagram of a lithography apparatus in accordance with embodiments. FIGS. 2 to 4 illustrate perspective views of electrodes of the lithography apparatus. FIG. 5 illustrates an enlarged view showing a part of the lithography apparatus in detail.

Referring to FIG. 1, a lithography apparatus in accordance with embodiments may include a stage 13, a main unit 21 on the stage 13, an auxiliary unit 41, and an electric field unit 31, 33, and 35. The electric field unit 31, 33, and 35 may include a lower electrode 31, an upper electrode 33, and a power supply system 35. A substrate 51 on which a photoresist film is formed may be installed on the stage 13. For example, the stage 13 may accommodate the substrate 51 including the photoresist film thereon.

The stage 13 may be arranged to face the main unit 21. For example, the stage 13 may be located under the main unit 21. The stage 13 may include an electrostatic discharge (ESD) system or a vacuum system fixing the substrate 51. The photoresist film may include an extreme ultraviolet (EUV) resist.

The main unit 21 may function to or be configured to irradiate a projection beam 22 onto the photoresist film on the substrate 51. The projection beam 22 may be, e.g., an EUV beam or an electronic beam (E-beam). The main unit 21 may include an EUV generating apparatus or an E-beam generating apparatus. Hereinafter, embodiments will be described assuming that the projection beam 22 is the EUV, and the main unit 21 includes the EUV generating apparatus.

The lower electrode 31 may include a conductive material, e.g., a metal plate. The lower electrode 31 may be installed at a lower end of or inside of the stage 13. The lower electrode 31 may have a horizontal width greater than or the same as that of the substrate 51. The upper electrode 33 may be installed between the substrate 51 and the main unit 21. The upper electrode 33 may have a horizontal width greater than or the same as that of the substrate 51. The substrate 51 may be arranged between the lower electrode 31 and the upper electrode 33. The power supply system 35 may supply a DC power or an AC power to the lower electrode 31 and the upper electrode 33. For example, a power having frequencies of about 1 Hz to about 300 MHz and peak-to-peak voltages of about 5 KV to about 50 KV may be provided to the lower electrode 31 and the upper electrode 33, through the power supply system 35.

The electric field unit 31, 33, and 35 may function to or be configured to apply an electric field onto the photoresist film on the substrate 51. A vertical electric field may be applied with respect to a surface of the photoresist film on the substrate 51 by the electric field unit 31, 33, and 35. The electric field may be interpreted to be perpendicular to a front surface of the substrate 51. The electric field unit 31, 33, and 35 may be controlled to be or configured to be turned on at the same time as irradiation of the projection beam 22, and controlled to be or configured to be turned off at the same time as termination of the projection beam 22. For example, the electric field may be controlled to be or configured to be applied at the same time as the irradiation of the projection beam 22, and controlled to be or configured to be turned off at the same time as the termination of the projection beam 22.

In an implementation, the electric field unit 31, 33, and 35 may be controlled to be or configured to be turned on before irradiation of the projection beam 22, and controlled to be or configured to be turned off after termination of the projection beam 22. In an implementation, the electric field unit 31, 33, and 35 may be controlled to be or configured to be turned on before the irradiation of the projection beam 22 and controlled to be or configured to be turned off at the same time as the termination of the projection beam 22. In an implementation, the electric field unit 31, 33, and 35 may be controlled to be or configured to be turned on at the same time as the irradiation of the projection beam 22, and controlled to be or configured to be turned off after the termination of the projection beam 22. In an implementation, the electric field may be controlled to be or configured to be applied before the irradiation of the projection beam 22, and controlled to be or configured to be turned off after the termination of the projection beam 22. In an implementation, the electric field may be controlled to be or configured to be applied before the irradiation of the projection beam 22, and controlled to be or configured to be turned off at the same time as the termination of the projection beam 22. In an implementation, the electric field may be controlled to be or configured to be applied at the same time as the irradiation of the projection beam 22, and controlled to be or configured to be turned off after the termination of the projection beam 22.

The auxiliary unit 41 may be arranged adjacent to the main unit 21. The auxiliary unit 41 may function to or be configured to irradiate an auxiliary beam 42 onto the photoresist film on the substrate 51. The auxiliary beam 42 may be a light having a longer wavelength than the projection beam 22, or may be a microwave. For example, the auxiliary unit 41 may include an infrared light generator. The long wavelength light used in the auxiliary beam 42 may have a wavelength of about 350 nm or more. For example, the long wavelength light may have a wavelength of 365 nm, 435 nm, 633 nm, or 808 nm. The microwave used in the auxiliary beam 42 may be an electromagnetic wave of about 300 MHz to about 30 GHz. In an implementation, the auxiliary unit 41 may be controlled to be or configured to be turned on at the same time as irradiation of the projection beam 22, and controlled to be or configured to be turned off at the same time as termination of the projection beam 22. In an implementation, the auxiliary beam 42 may be controlled to be or configured to be turned on at the same time as the irradiation of the projection beam 22, and controlled to be or configured to be turned off at the same time as the termination of the projection beam 22.

In an implementation, the auxiliary unit 41 may be controlled to be or configured to be turned on before irradiation of the projection beam 22 and controlled to be or configured to be turned off after termination of the projection beam 22. In an implementation, the auxiliary unit 41 may be controlled to be or configured to be turned on before the irradiation of the projection beam 22 and controlled to be or configured to be turned off at the same time as the termination of the projection beam 22. In an implementation, the auxiliary unit 41 may be controlled to be or configured to be turned on at the same time as the irradiation of the projection beam 22 and controlled to be or configured to be turned off after the termination of the projection beam 22.

For example, the projection beam 22 may be an EUV having a wavelength of 13.5 nm and a high energy of 92.5 eV. The projection beam 22 may have an anisotropic property. The projection beam 22 may react with a polymer matrix included in the photoresist film on the substrate 51 to generate secondary electrons having an energy of about 15 eV to about 80 eV. Thermal electrons having an energy lower than about 15 eV among the secondary electrons may react with a photo-acid generator (PAG) included in the photoresist film on the substrate 51 to generate an acid. The thermal electrons may have an isotropic property.

A vertical electric field may be applied to the photoresist film on the substrate 51 by the electric field unit 31, 33, and 35. The vertical electric field may help suppress lateral diffusion of the secondary electrons and may help enhance vertical diffusion. The vertical electric field may help improve resolution of a pattern by suppressing the lateral diffusion of the thermal electrons. The vertical electric field may contribute to increase effective thermal electrons by enhancing the vertical diffusion of the thermal electrons. The vertical electric field may help improve a depth of a pattern by enhancing the vertical diffusion of the thermal electrons.

The auxiliary beam 42 may not directly react with a polymer matrix or a PAG. Among the thermal electrons, those that have a low energy and do not react with the PAG may absorb energy supplied from the auxiliary beam 42 to then be involved in the reaction with the PAG. The auxiliary beam 42 may contribute to increase of the effective thermal electrons.

A degree of non-uniformity of distribution of contact-holes within a field of view (FOV) may be defined as a local critical dimension (CD) uniformity (LCDU). The LCDU may be significantly improved by using the electric field unit 31, 33, and 35 and the auxiliary unit 41. The increase of effective thermal electrons may be advantageous by decreasing a dose of the projection beam 22 used to obtain a desired pattern. The decrease of the dose of the projection beam 22 may significantly contribute to an increase of mass production efficiency of a lithography apparatus.

The electric field unit 31, 33, and 35 and/or the auxiliary unit 41 may be an effective thermal electron enhancement unit.

Referring to FIG. 2, the upper electrode 33 may include an opening 33H to transmit the projection beam (reference numeral 22 in FIG. 1) and the auxiliary beam (reference numeral 42 in FIG. 1). The upper electrode 33 may be a conductive material, e.g., a metal plate. In an implementation, the opening 33H may have a rounded shape.

Referring to FIG. 3, in an implementation, the opening 33H may have a polygonal or tetragonal shape. In an implementation, the opening 33H may have various shapes, e.g., a rectangle, a semicircle, a grid, or a combination thereof.

Referring to FIG. 4, an upper electrode 33A may include a transparent electrode. The upper electrode 33A may be a plate. The projection beam (reference numeral 22 in FIG. 1) and the auxiliary beam (reference numeral 42 in FIG. 1) may pass through the upper electrode 33A to be irradiated to the photoresist film on the substrate 51.

Referring to FIG. 5, the main unit 21 may include, e.g., a light source 23, illumination mirrors 24, and projection mirrors 27. A reticle 25 may be installed in the main unit 21. The reticle 25 may include a reflective mask pattern. The light source 23 may be an EUV generating apparatus. For example, a laser-induced plasma technology, a free electron laser technology, or a synchrotron technology may be used in the EUV generating apparatus. In an implementation, a beam of radiation 28 emitted from the light source 23 may have a wavelength of 13.5 nm.

The illumination mirrors 24 and the projection mirrors 27 may include a concave mirror, a convex mirror, and/or a flat mirror. The beam of radiation 28 emitted from the light source 23 may be reflected at the reticle 25 via the illumination mirrors 24. The projection beam 22 reflected from the reticle 25 may be irradiated to the photoresist film on the substrate (reference numeral 51 in FIG. 1) via the projection mirrors 27. The projection beam 22 may have a straight-moving property.

FIGS. 6 to 9 illustrate schematic diagrams of lithography apparatuses in accordance with embodiments.

Figure 6:
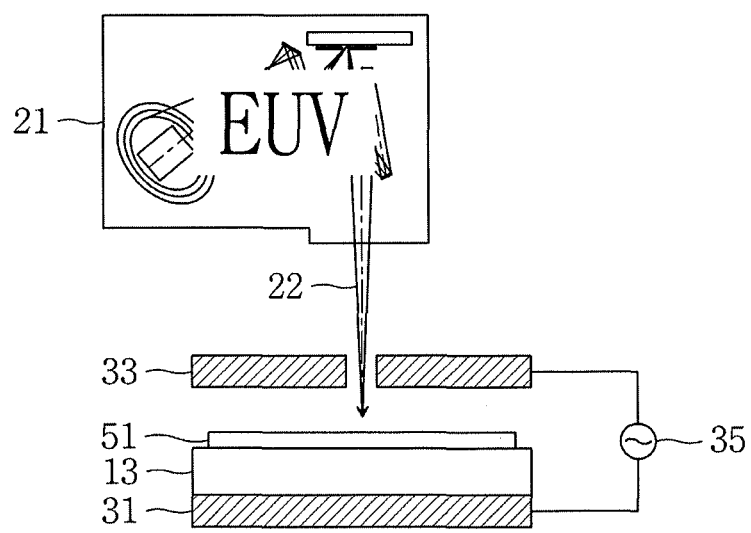
FIGS. 6 to 9 illustrate schematic of describing lithography apparatuses in accordance with embodiments.

Referring to FIG. 6, a lithography apparatus in accordance with embodiments may include a stage 13, a main unit 21, and an electric field unit 31, 33, and 35. The electric field unit 31, 33, and 35 may include a lower electrode 31, an upper electrode 33, and a power supply system 35. The auxiliary unit (reference numeral 41 in FIG. 1) may be omitted. The electric field unit 31, 33, and 35 may function to or may be configured to apply a vertical electric field to a photoresist film on a substrate 51.

Figure 7:
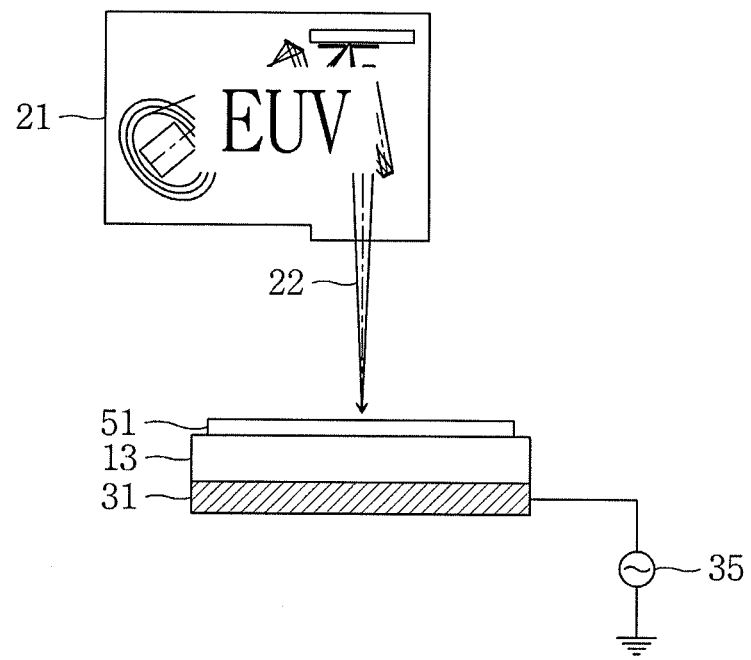

Referring to FIG. 7, a lithography apparatus in accordance with embodiments may include a stage 13, a main unit 21, and an electric field unit 31 and 35. The electric field unit 31 and 35 may include a lower electrode 31 and a power supply system 35. One end of the power supply system 35 may be grounded. The upper electrode (reference numeral 33 in FIG. 1) and the auxiliary unit (reference numeral 41 in FIG. 1) may be omitted. The electric field unit 31 and 35 may function to or may be configured to apply a vertical electric field to a photoresist film on a substrate 51.

Figure 8:
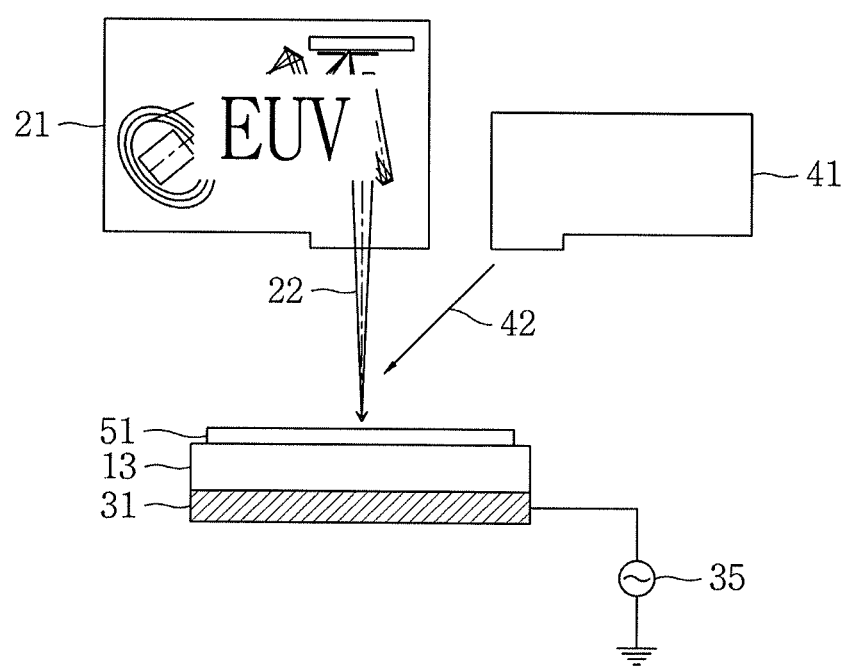

Referring to FIG. 8, a lithography apparatus in accordance with embodiments may include a stage 13, a main unit 21, an auxiliary unit 41, and an electric field unit 31 and 35. The electric field unit 31 and 35 may include a lower electrode 31 and a power supply system 35. One end of the power supply system 35 may be grounded. The upper electrode (reference numeral 33 in FIG. 1) may be omitted. The electric field unit 31 and 35 may function to or may be configured to apply a vertical electric field to a photoresist film on a substrate 51. The auxiliary unit 41 may function to or may be configured to irradiate an auxiliary beam 42 to the photoresist film on the substrate 51.

Figure 9:
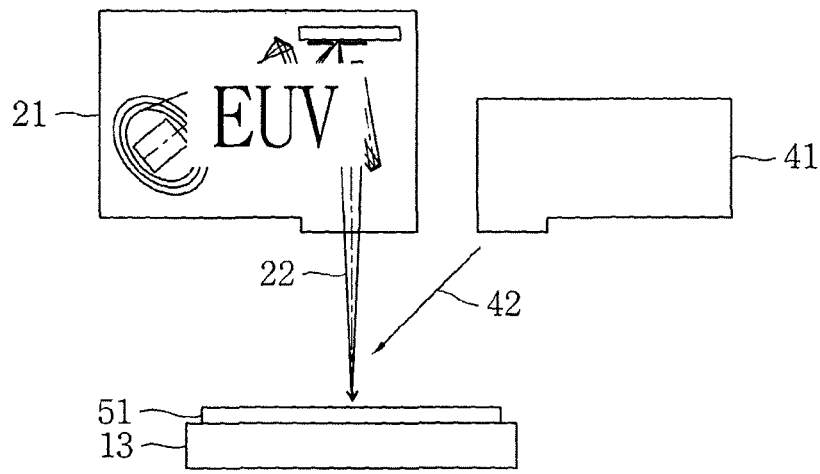

Referring to FIG. 9, a lithography apparatus in accordance with embodiments may include a stage 13, a main unit 21, and an auxiliary unit 41. The electric field unit (reference numerals 31, 33, and 35 in FIG. 1) may be omitted. The auxiliary unit 41 may function to or may be configured to irradiate an auxiliary beam 42 to the photoresist film on the substrate 51.

FIGS. 10 to 14 illustrate flowcharts describing methods of forming a pattern using lithography apparatuses in accordance with embodiments. FIGS. 15 to 19 illustrate cross-sectional views of stages in methods of forming a pattern using the lithography apparatuses in accordance with embodiments.

Figure 10:
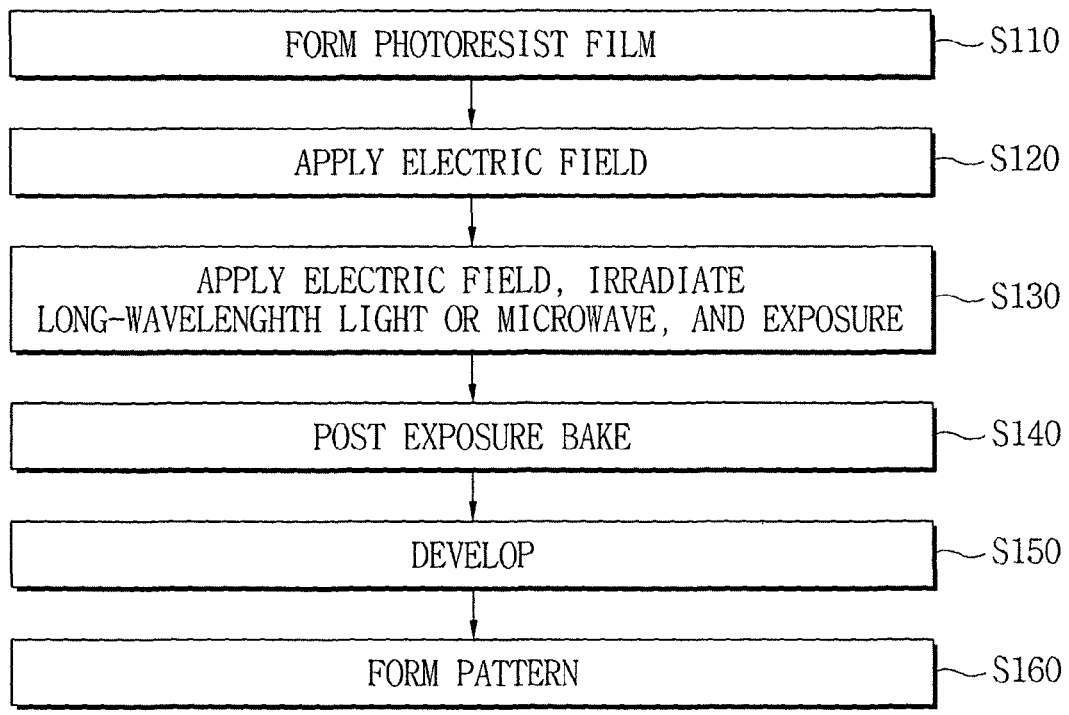
FIGS. 10 to 14 illustrate flowcharts describing methods of forming a pattern using lithography apparatuses in accordance with embodiments.

Referring to FIG. 10, a method of forming a pattern using a lithography apparatus in accordance with embodiments may include forming a photoresist film (S110), applying an electric field (S120), performing an exposure process while irradiating a long wavelength light source or a microwave at the same time as applying the electric field (S130), performing a post-exposure bake (PEB) process (S140), performing a development process (S150), and forming a pattern (S160).

Figure 11:
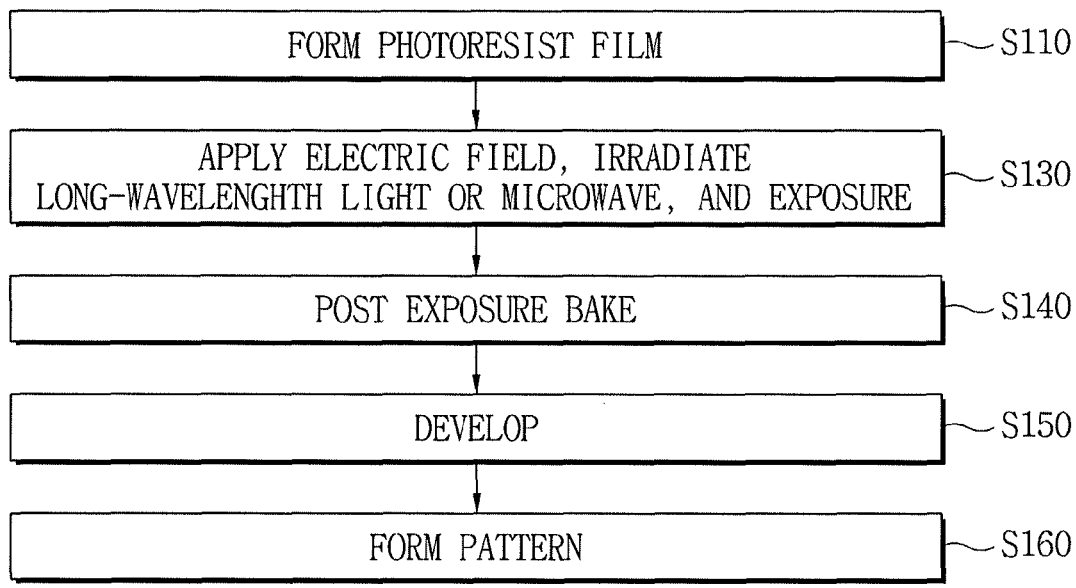

Referring to FIG. 11, a method of forming a pattern using a lithography apparatus in accordance with embodiments may include forming a photoresist film (S110), performing an exposure process while irradiating a long wavelength light source or a microwave at the same time as applying an electric field (S130), performing a PEB process (S140), performing a development process (S150), and forming a pattern (S160).

Figure 12:
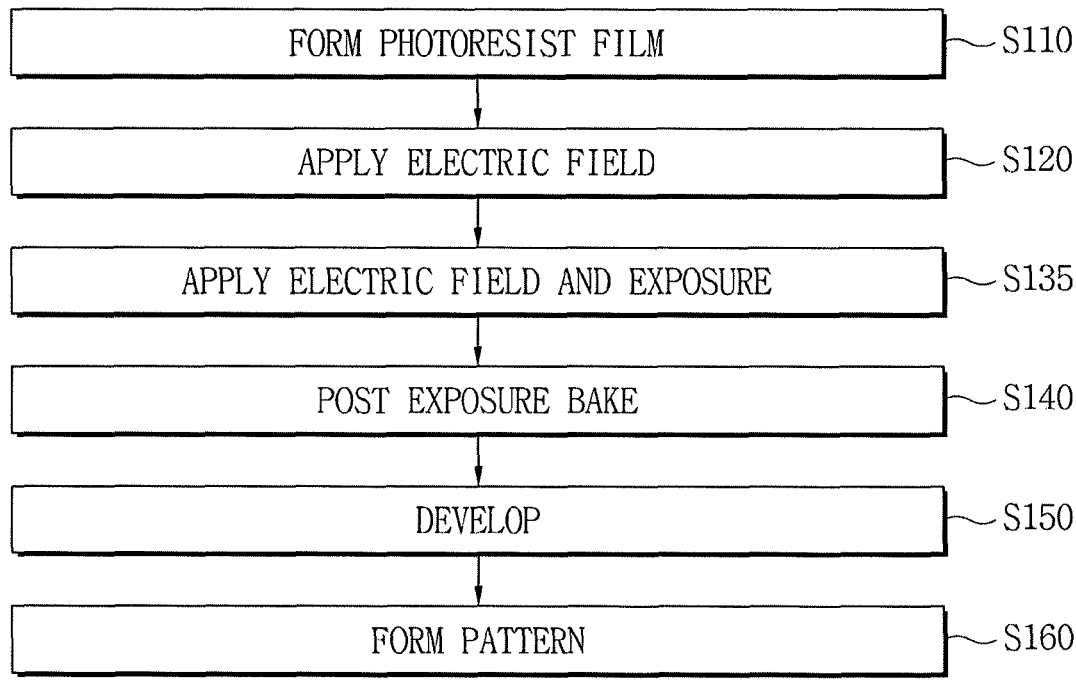

Referring to FIG. 12, a method of forming a pattern using a lithography apparatus in accordance with embodiments may include forming a photoresist film (S110), applying an electric field (S120), performing an exposure process while applying an electric field (S135), performing a PEB process (S140), performing a development process (S150), and forming a pattern (S160).

Figure 13:
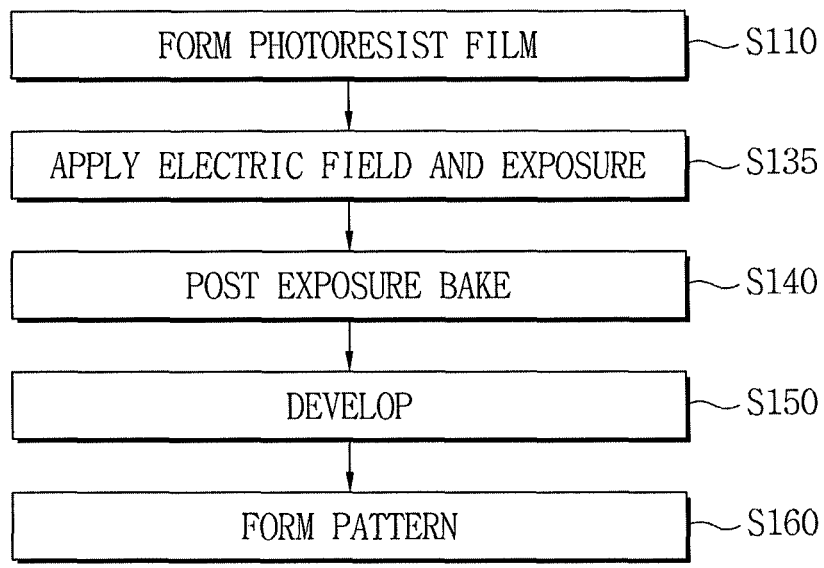

Referring to FIG. 13, a method of forming a pattern using a lithography apparatus in accordance with embodiments may include forming a photoresist film (S110), performing an exposure process while applying the electric field (S135), performing a PEB process (S140), performing a development process (S150), and forming a pattern (S160).

Figure 14:
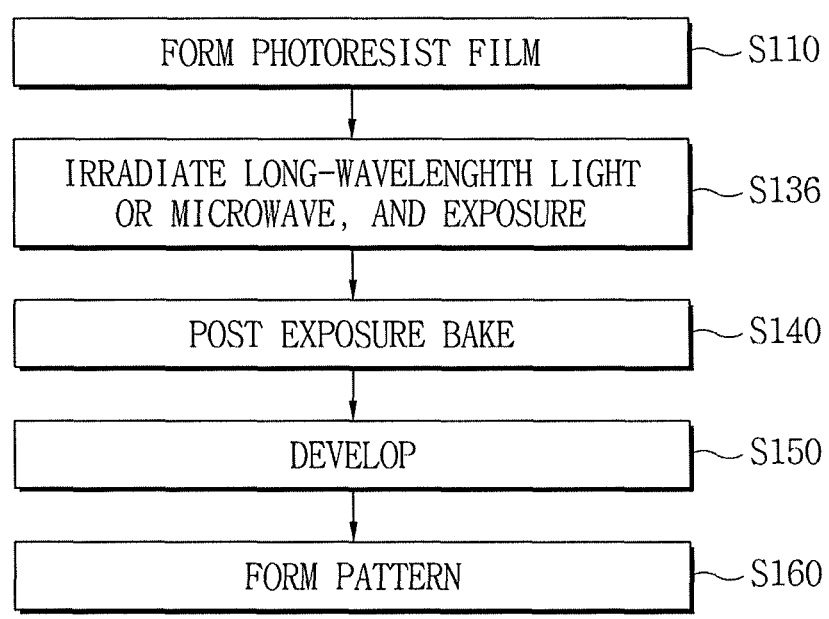

Referring to FIG. 14, a method of forming a pattern using a lithography apparatus in accordance with an embodiment may include forming a photoresist film (S110), performing an exposure process while irradiating a long wavelength light source or a microwave (S136), performing a PEB process (S140), performing a development process (S150), and forming a pattern (S160).

Figure 15:
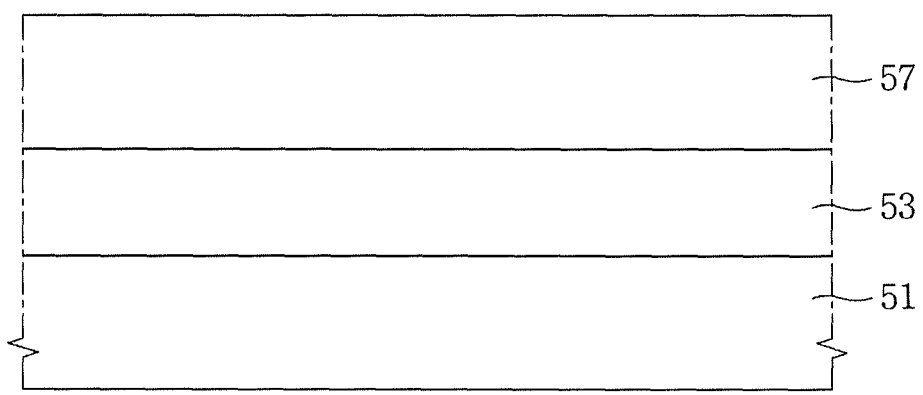
FIGS. 15 to 19 illustrate cross-sectional views of stages in methods of forming a pattern using lithography apparatuses in accordance with embodiments.

Referring to FIGS. 10 and 15, a thin film 53 and a photoresist film 57 may be sequentially stacked on a substrate 51 (S110).

The substrate 51 may be a semiconductor substrate, e.g., a silicon wafer and/or a silicon on insulator (SOI) wafer. The thin film 53 may cover a front surface of the substrate 51. The thin film 53 may include, e.g., a dielectric layer, a conductive layer, or a combination thereof. The photoresist film 57 may cover the thin film 53 in a uniform thickness.

The photoresist film 57 may be formed using an EUV resist. The EUV resist may include, e.g., a polymer matrix, a PAG, or another material. In an implementation, the photoresist film 57 may be a positive photoresist.

In an implementation, the photoresist film 57 may be a negative photoresist. In an implementation, the thin film 53 may be omitted, and the photoresist film 57 may be in contact with the substrate 51. In an implementation, other layers may be formed between the substrate 51 and the thin film 53. In an implementation, the photoresist film 57 may be a single layer or a multiple layer.

Figure 16:
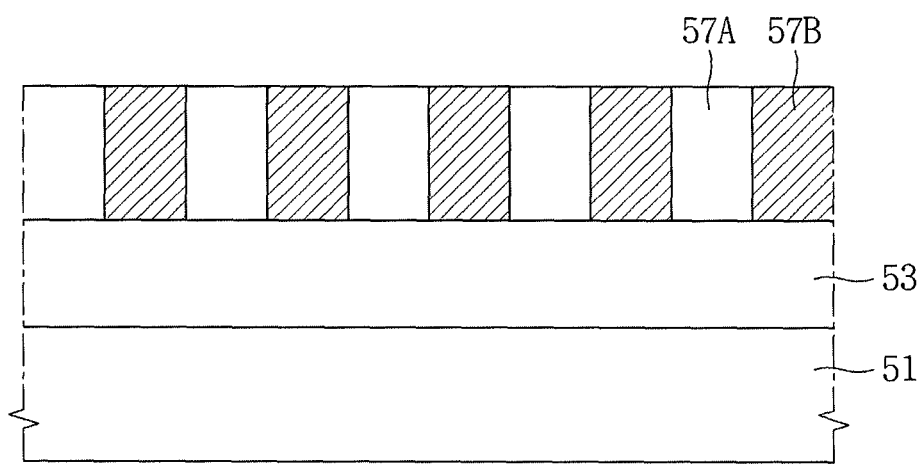

Referring to FIGS. 1, 10, and 16, the substrate 51 having the photoresist film 57 may be installed on the stage 13. A back surface of the substrate 51 may be in contact with the stage 13. Using the electric field unit 31, 33, and 35, an electric field may be applied to the photoresist film 57 on the substrate 51 (S120). The electric field may be perpendicular to an upper surface of the photoresist film 57. For example, the electric field may be a vertical electric field. For example, the electric field may be perpendicular to the front surface of the substrate 51. While the auxiliary beam 42 is irradiated using the auxiliary unit 41 at the same time as applying the electric field, the projection beam 22 may be irradiated using the main unit 21 to form light-sensing areas 57B (S130). A non-light-sensing area 57A may remain between the light-sensing areas 57B.

The projection beam 22 may be an EUV having a wavelength of 13.5 nm and a high energy of 92.5 eV. The projection beam 22 may have an anisotropic property. The projection beam 22 irradiated to the photoresist film 57 may react with the polymer matrix in the photoresist film 57 to generate secondary electrons having an energy of about 15 eV to about 80 eV. Thermal electrons having an energy lower than 15 eV among the secondary electrons may react with the PAG in the photoresist film 57 to generate an acid. The thermal electrons may have an isotropic property. The moving direction and activity of the thermal electrons may affect the quality of the light-sensing areas 57B.

The vertical electric field applied to the photoresist film 57 by the electric field unit 31, 33, and 35 may help suppress lateral diffusion of the thermal electrons and may help enhance vertical diffusion of the thermal electrons. The auxiliary beam 42 may be a light having a longer wavelength than the projection beam 22, or a microwave. Among the thermal electrons, those that have low energy and do not react with the PAG may absorb energy supplied from the auxiliary beam 42 to then be involved in the reaction with the PAG. For example, the electric field unit 31, 33, and 35 and the auxiliary unit 41 may help increase the effective thermal electrons.

A PEB process may be performed for the substrate 51 having the light-sensing areas 57B (S140).

Figure 17:
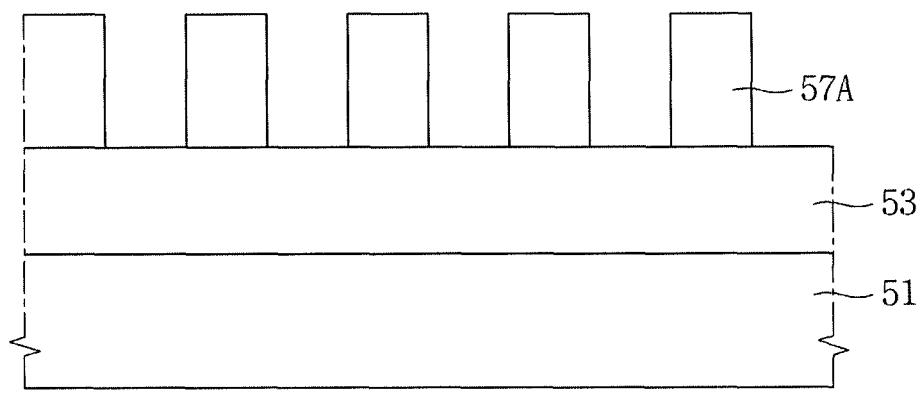

Referring to FIGS. 10 and 17, the light-sensing areas 57B may be removed, and the thin film 53 may be partly exposed by performing a development process (S150). The non-light-sensing area 57A may remain on the thin film 53. The non-light-sensing area 57A may be referred to as a mask pattern 57A.

Figure 18:
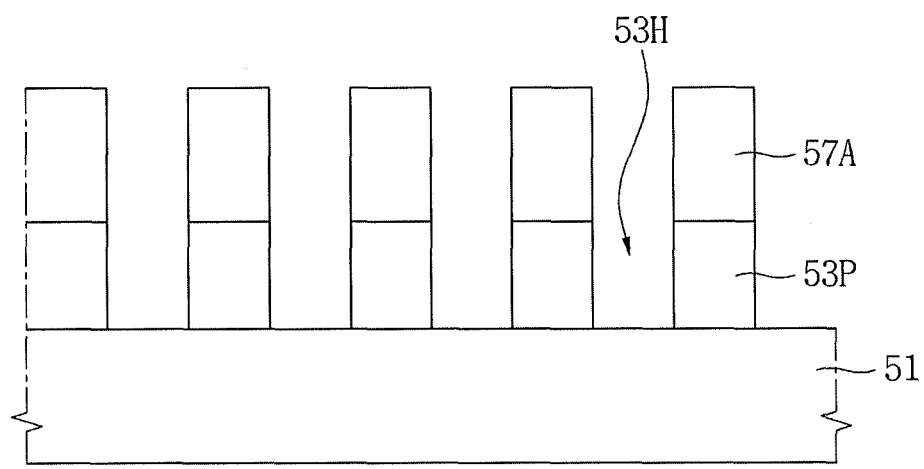

Referring to FIGS. 10 and 18, trenches 5311 and a pattern 53P may be formed by partly etching the thin film 53 using the mask pattern 57A as an etch mask (S160). The formation of the trenches 53H and the pattern 53P may use an anisotropic etching process, an isotropic etching process, or a combination thereof. Each of the trenches 53H and the pattern 53P may have a vertical height greater than a horizontal width.

In an implementation, each of the trenches 53H may be a contact hole.

Figure 19:
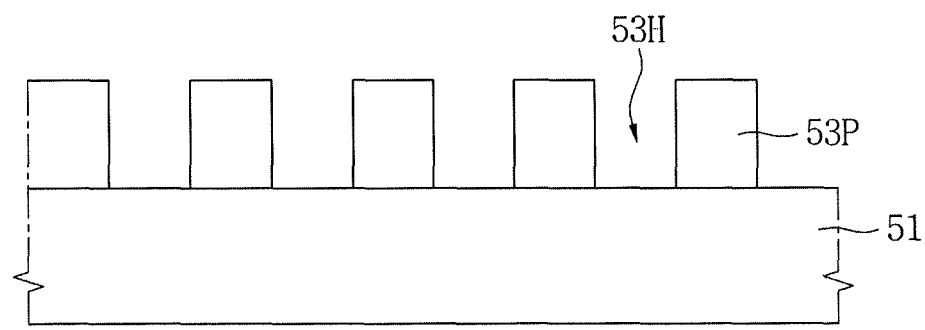

Referring to FIGS. 10 and 19, the trenches 53H and the pattern 53P may be exposed on the substrate 51 by removing the mask pattern 57A. Each of the trenches 53H and the pattern 53P may have a high aspect ratio.

In an implementation, patterns and semiconductor devices may be formed by various combinations of methods and devices of FIGS. 1 to 19.

FIGS. 20 to 23 illustrate perspective views and system block diagrams of electronic apparatuses in accordance with embodiments.

Figure 20:
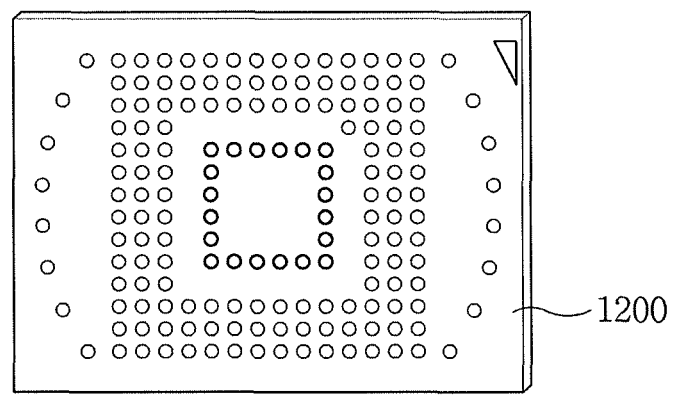
FIGS. 20 to 23 illustrate perspective views and system block diagrams showing electronic apparatuses in accordance with embodiments.
Figure 21:
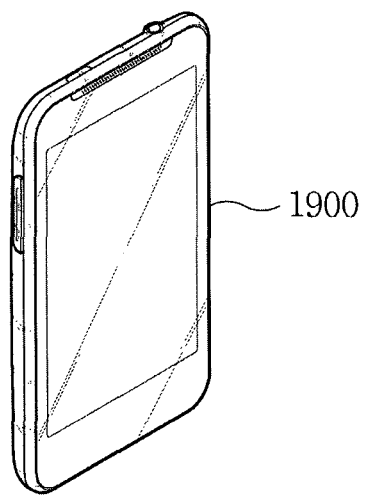

Referring to FIGS. 20 and 21, the semiconductor device described with reference to FIGS. 1 to 19 may be usefully applied to electronic systems, such as an embedded multimedia chip (eMMC) 1200, a smart phone 1900, a netbook, a laptop computer, or a tablet PC. For example, a semiconductor device formed by a method of forming a pattern using the lithography apparatuses described with reference to FIGS. 1 to 19 may be installed in a mainboard of the smart phone 1900.

Figure 22:
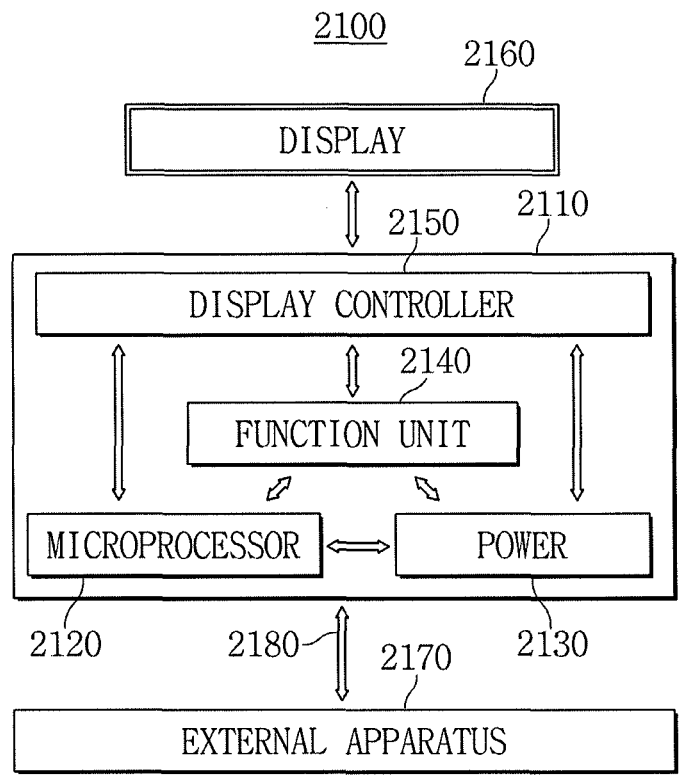

Referring to FIG. 22, a semiconductor device formed by a method of forming a pattern using the lithography apparatuses described with reference to FIGS. 1 to 19 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be arranged inside or outside of the body 2110. For example, the display unit 2160 may be arranged on a surface of the body 2110 and display an image processed by the display controller unit 2150.

The power unit 2130 may receive a constant voltage from an external battery (not shown), etc., divide the voltage into various voltage levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a smart phone, the function unit 2140 may have several components which perform functions of the mobile phone such as outputting an image to the display unit 2160 or outputting a voice to a speaker, by dialing or communication with an external apparatus 2170. If a camera is installed, the function unit 2140 may function as a camera image processor.

In the embodiment, when the electronic system 2100 is connected to a memory card, or the like, in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), or the like, in order to expand functionality, the function unit 2140 may function as an interface controller. Further, the function unit 2140 may include a mass storage apparatus.

The semiconductor device formed by a method of forming a pattern using the lithography apparatuses described with reference to FIGS. 1 to 19 may be applied to the function unit 2140 or the microprocessor unit 2120.

Figure 23:
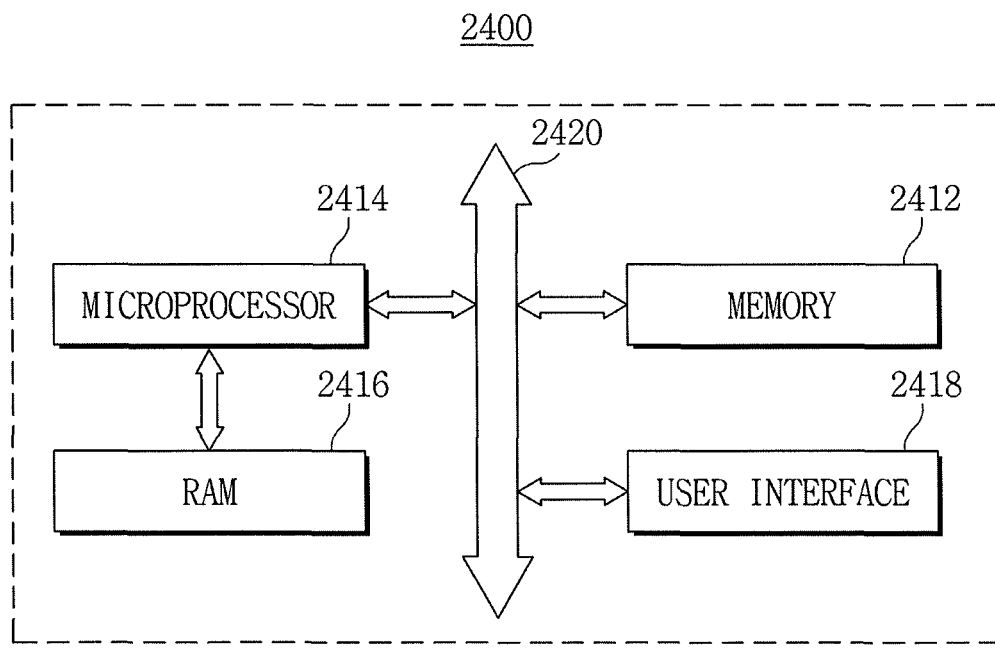

Referring to FIG. 23, an electronic system 2400 may include at least one of semiconductor devices in accordance with various embodiments. The electronic system 2400 may be used to fabricate a mobile apparatus or a computer. For example, the electronic system 2400 may include a memory 2412, a microprocessor 2414 performing data communication using a bus 2420, a random access memory (RAM) 2416, and a user interface 2418. The microprocessor 2414 may program and control the electronic system 2400. The RAM 2416 may be used as an operation memory of the microprocessor 2414. For example, the microprocessor 2414 or the RAM 2416 may include at least one of semiconductor devices in accordance with embodiments. The microprocessor 2414, the RAM 2416, and/or other components can be assembled in a single package. The user interface 2418 may be used to input data to, or output data from the electronic system 2400. The memory 2412 may store codes for operating the microprocessor 2414, data processed by the microprocessor 2414, or external input data. The memory 2412 may include a controller and a memory device.

By way of summation and review, in a EUV lithography process, resolution degradation and local CD uniformity (LCDU) degradation may occur due to secondary electron blur.

For example, in some KrF or ArF photoresist films, a photo acid generator (PAG) may immediately react to light, decompose, and generate an acid. On the contrary, the reaction mechanism of an EUV resist may be that, among the secondary electrons generated by a polymer matrix reacting to a light having high energy of 92.5 eV, thermal electrons having energy of lower than 15 eV act on a PAG to form an acid. The secondary electrons may have an isotropic property. Therefore, distribution quality as well as optical quality of light irradiated to the EUV resist may determine image quality of a resist pattern.

A method of increasing the amount of light irradiated to the EUV resist in order to increase resolution, may be disadvantageous in terms of throughput. Sensitivity of the EUV resist may be delicately adjusted in order to increase productivity. The sensitivity of the EUV resist may be represented by dose. For example, an EUV resist requiring a dose of 15 mJ/cm$^2$ may be advantageous in terms of throughput of an EUV scanner compared to an EUV resist requiring a dose of 40 mJ/cm$^2$. A degree of non-uniformity of distribution of contact holes in a field of view (FOV) may be defined as a local CD uniformity (LCDU). The dose and the LCDU have a trade-off relationship. For example, a larger number of thermal electrons may help improve the LCDU and a smaller number of thermal electrons may help improve the dose. Further, a secondary electron diffusion length may be small to help improve the LCDU, and may be large to help improve the dose. A lithography apparatus for improving the LCDU and increasing mass productivity, may be desirable.

In accordance with the embodiments, a lithography apparatus may include a main unit that irradiates a projection beam to a photoresist film, an electric field unit that applies an electric field to the photoresist film, and/or an auxiliary unit that irradiates a light having a longer wavelength than the projection beam, or a microwave to the photoresist film. A vertical electric field may be applied to the photoresist film by the electric field unit. The vertical electric field may help suppress lateral diffusion of secondary electrons formed in the photoresist film by irradiating the projection beam, and may help enhance vertical diffusion. The auxiliary unit may contribute to the increase of effective thermal electrons. A lithography apparatus improving LCDU and increasing mass-product efficiency may be implemented.

The embodiments may provide a lithography apparatus that helps improve local CD uniformity (LCDU) and helps increase mass production efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A lithography apparatus, comprising:
a stage for accommodating a substrate that has a photoresist film thereon;
a main unit on the stage, the main unit being configured to irradiate a projection beam to the photoresist film;
an electric field unit adjacent to the stage, the electric field unit being configured to apply an electric field to the photoresist film; and
an auxiliary unit adjacent to the main unit, the auxiliary unit being configured to simultaneously irradiate a microwave onto the photoresist film at a same area irradiated by the projection beam,
wherein the electric field unit is configured to be turned on at a same time as or before irradiation of the projection beam, and is configured to be turned off at a same time as or after termination of the projection beam.

2. The lithography apparatus as claimed in claim 1, wherein the electric field is perpendicular to a surface of the substrate.

3. The lithography apparatus as claimed in claim 1, wherein the electric field unit includes:
a lower electrode under the stage; and
a power supply system connected to the lower electrode.

4. The lithography apparatus as claimed in claim 3, wherein the power supply system supplies a power having frequencies of about 1 Hz to about 300 MHz and peak-to-peak voltages of about 5 KV to about 50 KV.

5. The lithography apparatus as claimed in claim 3, wherein the electric field unit further includes an upper electrode connected to the power supply system, the upper electrode being arranged between the substrate and the main unit.

6. The lithography apparatus as claimed in claim 1, wherein the projection beam includes an extreme ultraviolet (EUV) or electron beam (E-beam).

7. The lithography apparatus as claimed in claim 1, wherein the main unit includes an EUV generator and a reticle having a reflective mask pattern.

8. The lithography apparatus as claimed in claim 1, wherein the auxiliary unit is configured to be turned on at the same time as or before irradiation of the projection beam, and is configured to be turned off at the same time as or after termination of the projection beam.

9. The lithography apparatus as claimed in claim 1, wherein the microwave is in a range of about 300 MHz to about 30 GHz.

10. A method of forming a pattern, the method comprising:
   installing the substrate on which the photoresist film is formed, on the stage of the lithography apparatus as claimed in claim 1;
   applying the electric filed to the photoresist film;
   irradiating the projection beam to the photoresist film; and
   developing the photoresist film.

11. The method as claimed in claim 10, wherein the electric field is applied at a same time as or before irradiation of the projection beam, and is turned off at a same time as or after termination of the projection beam.

12. The method as claimed in claim 10, further comprising irradiating a microwave to the photoresist film, while irradiating the projection beam to the photoresist film.

13. The method as claimed in claim 10, further comprising irradiating the microwave onto the photoresist film at the same area as and simultaneously with the projection beam such that low energy secondary electrons having an energy of lower than about 15 eV that are formed by a reaction between the projection beam and the photoresist film are converted into high energy secondary electrons having an energy of about 15 eV to about 80 eV.

14. A lithography apparatus, comprising:
   a stage for accommodating a substrate having a photoresist film thereon;
   a main unit on the stage, the main unit being configured to irradiate a projection beam to the photoresist film; and
   an auxiliary unit adjacent to the stage, the auxiliary unit being configured to simultaneously irradiate a microwave onto the photoresist film at a same area irradiated by the projection beam,
   wherein the auxiliary unit is configured to be turned on at a same time as or before irradiation of the projection beam, and is configured to be turned off at the same time as or after termination of the projection beam.

15. A lithography apparatus, comprising:
   a stage for accommodating a substrate having a photoresist film thereon;
   a main unit on the stage, the main unit being configured to irradiate a projection beam to the photoresist film; and at least one of:
      an electric field unit adjacent to the stage, the electric field unit being configured to apply an electric field to the photoresist film, or
      an auxiliary unit adjacent to the stage, the auxiliary unit being configured to simultaneously irradiate a microwave onto the photoresist film at a same area irradiated by the projection beam,
   wherein:
   the electric field unit is configured to be turned on at a same time as or before irradiation of the projection beam, and is configured to be turned off at a same time as or after termination of the projection beam, and
   the auxiliary unit is configured to be turned on at a same time as or before irradiation of the projection beam, and is configured to be turned off at the same time as or after termination of the projection beam.

16. The lithography apparatus as claimed in claim 15, wherein the projection beam includes an extreme ultraviolet (EUV) or electron beam.

17. The lithography apparatus as claimed in claim 15, wherein the main unit includes an EUV generator and a reticle having a reflective mask pattern.

18. The lithography apparatus as claimed in claim 17, wherein the EUV generator generates EUV having a wavelength of 13.5 nm and an energy of 92.5 eV.

* * * * *